(12) United States Patent
Liu et al.

(10) Patent No.: US 8,782,379 B2
(45) Date of Patent: Jul. 15, 2014

(54) H.264 VIDEO DECODER CABAC CORE OPTIMIZATION TECHNIQUES

(75) Inventors: Zhen Liu, San Diego, CA (US); Kai Wang, San Diego, CA (US); Yiliang Bao, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 471 days.

(21) Appl. No.: 11/862,942

(22) Filed: Sep. 27, 2007

(65) Prior Publication Data
US 2009/0089549 A1 Apr. 2, 2009

(51) Int. Cl.
*G06F 9/00* (2006.01)

(52) U.S. Cl.
USPC .......................................................... 712/223

(58) Field of Classification Search
None
See application file for complete search history.

(56) References Cited

U.S. PATENT DOCUMENTS

| | | |
|---|---|---|
| 2004/0240559 A1 | 12/2004 | Prakasam et al. |
| 2005/0018774 A1 | 1/2005 | Winger et al. |
| 2006/0023795 A1 | 2/2006 | Kim |
| 2007/0080832 A1 | 4/2007 | Yang et al. |

FOREIGN PATENT DOCUMENTS

| | | |
|---|---|---|
| CN | 1949873 A | 4/2007 |
| JP | 2006054865 A | 2/2006 |
| JP | 2007202142 A | 8/2007 |

OTHER PUBLICATIONS

Hongbo Zhu et al., "A new arithmetic coding using byte-based renormalization and table-based interval division", Jan. 2006, Video Coding Experts Group.*
D. Marpe, H. Schwarz, and T. Wiegand, "Context-Based Adaptive Binary Arithmetic Coding in the H.264/AVC Video Compression Standard," IEEE Trans. Circuits Syst. Video Technol., vol. 13, pp. 620-636, Jul. 2003.
R. Osorio and J. Bruguera, "Arithmetic Coding Architecutre for H.264/AVC CABAC Compression System," Proc. EUROMICRO Systems on Digital System Design, 2004.
W. Yu and Y. He, "A High Performance CABAC Decoding Architecture," IEEE Trans. Consumer Electrionics, vol. 51, pp. 1352-1359, Nov. 2005.
C.-H. Kim and I.C. Park, "High Speed Decoding of Context-based Adaptive Binary Arithmetic Codes Using Most Probable Symbol Prediction," ISCAS 2006.
H. Shojania, S. Sudarsanan, "A VLSI Architecture for High Performance CABAC Encoding," Visual Communications and Image Processing, Proc. of SPIE vol. 5960 WA, 2005.
Said, "Introduction to Arithmetic Coding—Theory and Practice," a book chapter in Lossless Compression Handbook by Khalid Sayood, 2004.
Peng Zhang et al: "High-Performance CABAC Engine for H.264/AVC High Definition Real-Time Decoding" Consumer Electronics, 2007, ICCE 2007, Digest of Technical Papers, International Conference on, IEEE, PI, Jan. 1, 2007, pp. 1-2, XP031071403.

(Continued)

*Primary Examiner* — Robert Fennema
*Assistant Examiner* — John Lindlof
(74) *Attorney, Agent, or Firm* — Elaine H. Lo

(57) ABSTRACT

A device employing techniques to optimize Context-based Adaptive Binary Arithmetic Coding (CABAC) for the H.264 video decoding is provided. The device includes a processing circuit operative to implement a set of instructions to decode multiple bins simultaneously and renormalize an offset register and a range register after the multiple bins are decoded. The range register and offset registers may be 32 or 64 bits. The use of a larger range register allows renormalization to be skipped when enough bits are still in the range register.

23 Claims, 17 Drawing Sheets

(56) References Cited

OTHER PUBLICATIONS

Xu Mei-Hua et al: "Optimizing Design and FPGA Implementation for CABAC Decoder" High Density Packagaing and Microsystem Integration, 2007 International Symposium on, IEEE, PI, Jun. 1, 2007, pp. 1-5, XP031123001.
Euopean Patent Office—EP08006313, European Search Authority—Munich—Jan. 27, 2009.
International Search Report—PCT/US08/077754, International Search Authority—European Patent Office—Feb. 9, 2009.
Written Opinion—PCT/US08/077754, International Search Authority—European Patent Office—Feb. 9, 2009.
H.264 Telecommunication Standaedization Sector of ITU: "Series H: Audiovisual and multimedia systems, Infrastructure of audiovisual Services—Coding of moving video—Advanced video coding for generic audiovisual services", 2005.
Taiwan Search Report—TW097137397—TIPO Sep. 30, 2012.

\* cited by examiner

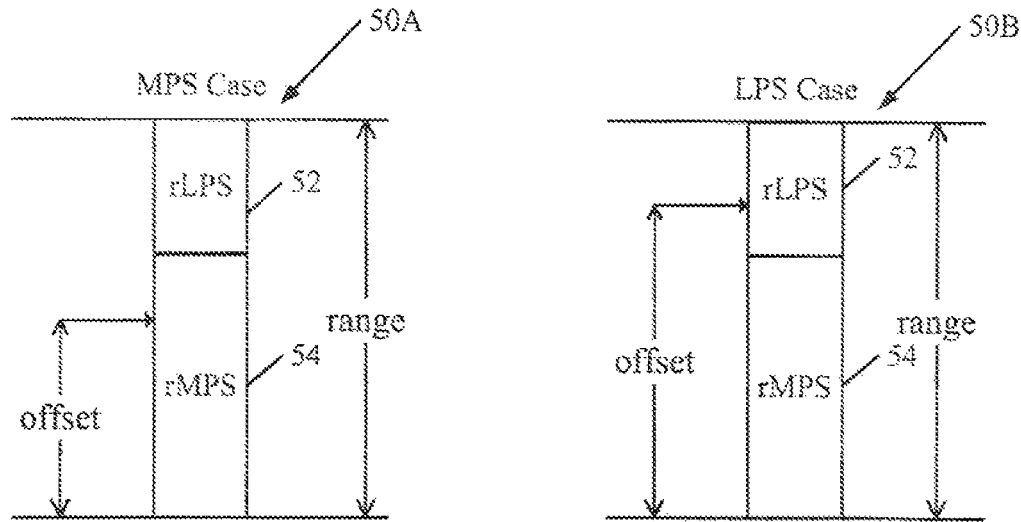
FIG. 2C
Prior Art
FIG. 2D
Prior Art
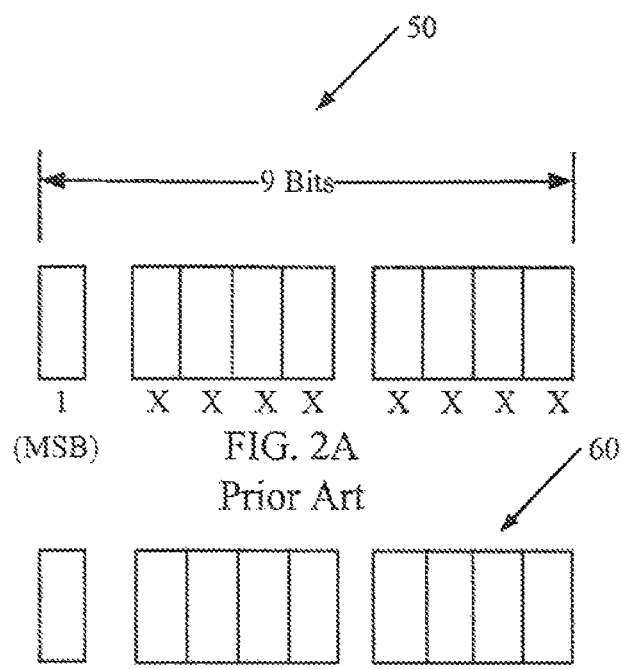
FIG. 2A
Prior Art
FIG. 2B
Prior Art

```
//range, offset both 9 bits
//range: 1 xxxx xxxx
//2^8<=range<2^9
//range>offset>=0
if(offset>=rMPS)
{//LPS case
  range_new=rLPS;
  offset_new=offset-rMPS;
}
else
{//MPS case
  range_new=rMPS;
  offset_new=offset;
}
```

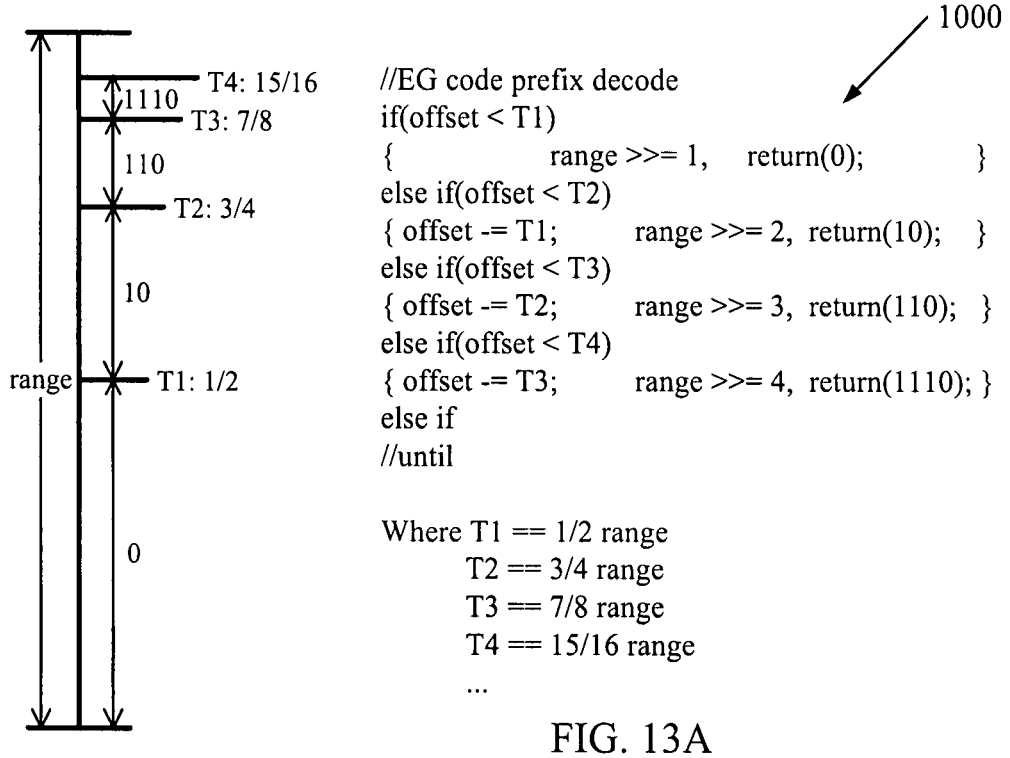
FIG. 13B
FIG. 13A
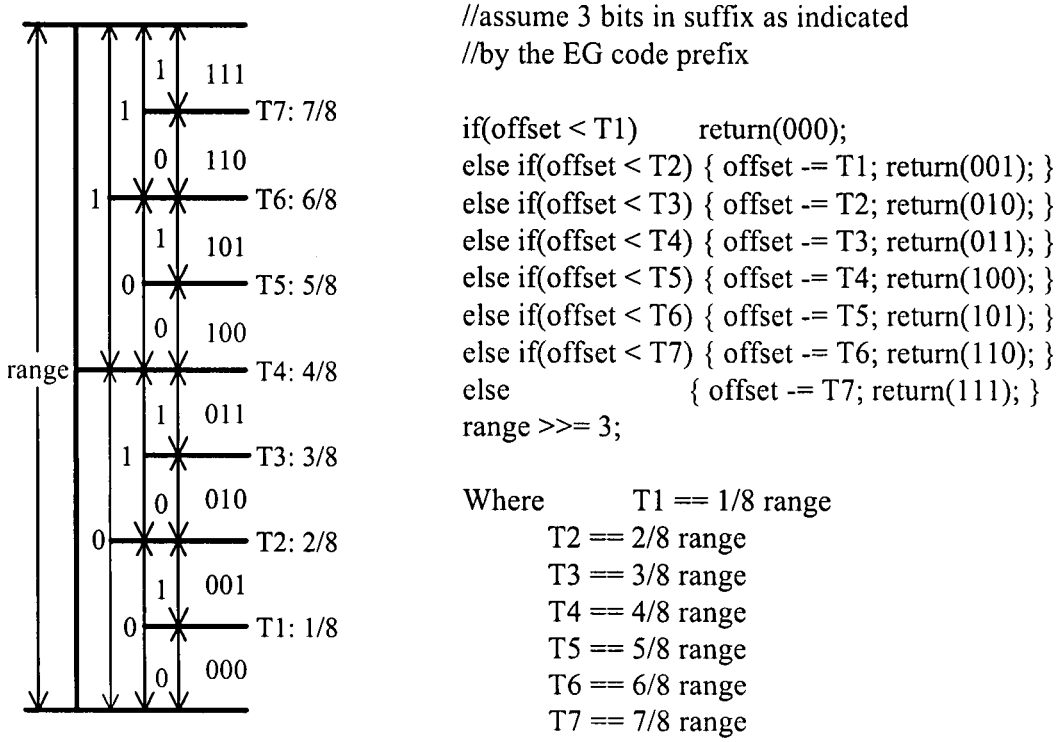
FIG. 14B
FIG. 14A

| Scanning position | 0 | 1 | 2 | 3 | 4 | 5 |
|---|---|---|---|---|---|---|
| Transform coefficients | 9 | 0 | -3 | -5 | 0 | 1 |
| significant_coeff_flag | 1 | 0 | 1 | 1 | 0 | 1 |
| last_significant_coeff_flag | 0 | | 0 | 0 | | 1 |
| coeff_abs_level_minus1 | 8 | | 2 | 4 | | 0 |
| coeff_sign_flag | 0 | | 1 | 1 | | 0 |

FIG. 16B

| Syntax Element Stream | |
|---|---|
| coded_block_flag | 1 |
| significant_coeff_flag | 1 |
| last_significant_coeff_flag | 0 |
| significant_coeff_flag | 0 |
| significant_coeff_flag | 1 |
| last_significant_coeff_flag | 0 |
| significant_coeff_flag | 1 |
| last_significant_coeff_flag | 0 |
| significant_coeff_flag | 0 |
| significant_coeff_flag | 1 |
| last_significant_coeff_flag | 1 |
| coeff_abs_level_minus1 | 0 |
| coeff_sign_flag | 0 |
| coeff_abs_level_minus1 | 4 |
| coeff_sign_flag | 0 |
| coeff_abs_level_minus1 | 2 |
| coeff_sign_flag | 1 |
| coeff_abs_level_minus1 | 8 |
| coeff_sign_flag | 0 |

FIG. 16A

| 9 | 0 | 1 | 0 |
|---|---|---|---|
| -3 | 0 | 0 | 0 |
| -5 | 0 | 0 | 0 |
| 0 | 0 | 0 | 0 |

FIG. 16C

H.264 VIDEO DECODER CABAC CORE OPTIMIZATION TECHNIQUES

FIELD

The present disclosure relates generally to the field of video decoding and, more specifically, to techniques for optimizing the Context-based Adaptive Binary Arithmetic Coding (CABAC) for the H.264 video decoding.

BACKGROUND

To support the H.264 main profile, the Context-based Adaptive Binary Arithmetic Coding (CABAC) is a technical challenge. The basic idea of the binary arithmetic coding process is recursive interval division. The arithmetic decoding engine core keeps two registers. The first register is a range register with 9-bits. The second register is an offset register which is 9-bits in a regular mode and 10-bits in a bypass mode. The range register keeps track of the width of the current interval. The offset is from the bit-stream and points to the current location within the range. When decoding a bin, the range is divided into two subintervals depending on the context to decode that specific bin. After the bin is decided, the range and offset are updated. After decoding one bin, range and offset will be renormalized to keep the precision to decode next bin. It ensures the most significant bit of the 9 bit register range is always 1. Thus, there are a great number of bit wise operations in the CABAC core, frequent renormalization and bitwise reading from a bit-stream, all of which are computationally costly.

There is therefore a continuing need for techniques for optimizing the Context-based Adaptive Binary Arithmetic Coding (CABAC) for the H.264 video decoding.

SUMMARY

Techniques for optimizing the Context-based Adaptive Binary Arithmetic Coding (CABAC) for the H.264 video decoding. In one configuration, a device comprising a processing circuit operative to implement a set of instructions to decode multiple bins simultaneously and renormalize an offset register and a range register, after the multiple bins are decoded is provided. The device also includes a memory coupled to the processing circuit.

In another aspect, an integrated circuit is provided comprising a processing circuit operative to implement a set of instructions to decode multiple bins simultaneously and renormalize an offset register and a range register, after the multiple bins are decoded. The integrated circuit also includes a memory coupled to the processing circuit.

In a still further aspect, a computer program product is provided including a computer readable medium having instructions for causing a computer to: decode multiple bins simultaneously. The computer program product also includes instructions to renormalize for multi-bit aligning an offset register and a range register, after the multiple bins are decoded.

Additional aspects will become more readily apparent from the detailed description, particularly when taken together with the appended drawings.

BRIEF DESCRIPTION OF THE DRAWINGS

Aspects and configurations of the disclosure will become more apparent from the detailed description set forth below when taken in conjunction with the drawings in which like reference characters identify corresponding elements throughout.

FIG. 2A shows an exemplary H.264 standard range register.

FIG. 2B shows an exemplary H.264 standard offset register.

FIG. 2C shows an exemplary H.264 standard MPS case.

FIG. 2D shows an exemplary H.264 standard LPS case.

FIG. 13A shows a sample (psuedocode) instruction set for a prefix EG code decoding process.

FIG. 13B shows a range and offset relationship diagram the prefix EG code decoding process of FIG. 13A.

FIG. 14A shows a sample (psuedocode) instruction set for a suffix EG code decoding process.

FIG. 14B shows a range and offset relationship diagram the suffix EG code decoding process of FIG. 14A.

FIGS. 16A, 16B and 16C shows a CABAC residual block syntax arrangement.

Figure 1:
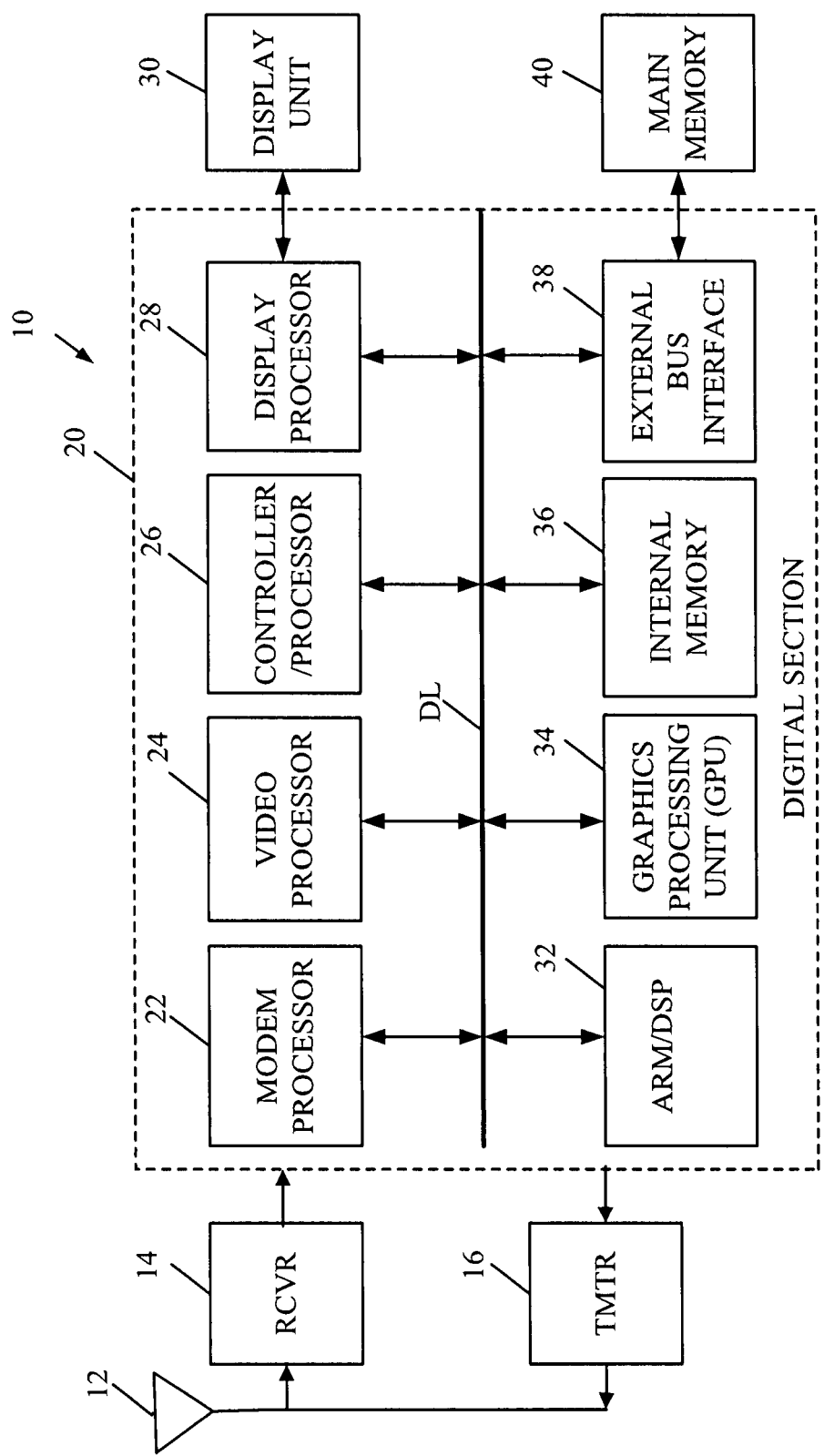
FIG. 1 shows a general block diagram of a wireless device.

The images in the drawings are simplified for illustrative purposes and are not depicted to scale. To facilitate understanding, identical reference numerals have been used, where possible, to designate identical elements that are common to the Figures, except that suffixes may be added, when appropriate, to differentiate such elements.

The appended drawings illustrate exemplary configurations of the invention and, as such, should not be considered as limiting the scope of the invention that may admit to other equally effective configurations. It is contemplated that features or steps of one configuration may be beneficially incorporated in other configurations without further recitation.

DETAILED DESCRIPTION

The word "exemplary" is used herein to mean "serving as an example, instance, or illustration." Any configuration or design described herein as "exemplary" is not necessarily to be construed as preferred or advantageous over other configurations or designs.

The techniques described herein may be used for wireless communications, computing, personal electronics, etc. An exemplary use of the techniques for wireless communication is described below.

FIG. 1 shows a block diagram of a configuration of a wireless device 10 in a wireless communication system. The wireless device 10 may be a cellular or camera phone, a terminal, a handset, a personal digital assistant (PDA), or some other device. The wireless communication system may be a Code Division Multiple Access (CDMA) system, a Global System for Mobile Communications (GSM) system, or some other system. A handset may be a cellular phone, wireless device, wireless communications device, a video game console, a wirelessly-equipped personal digital assistant (PDA), a laptop computer, or a video-enabled device.

The wireless device 10 is capable of providing bi-directional communications via a receive path and a transmit path. On the receive path, signals transmitted by base stations are received by an antenna 12 and provided to a receiver (RCVR) 14. The receiver 14 conditions and digitizes the received signal and provides samples to a digital section 20 for further processing. On the transmit path, a transmitter (TMTR) 16 receives data to be transmitted from the digital section 20, processes and conditions the data, and generates a modulated signal, which is transmitted via the antenna 12 to the base stations.

The digital section 20 includes various processing, interface and memory units such as, for example, a modem processor 22, a video processor 24, a controller/processor 26, a display processor 28, an ARM/DSP 32, a graphics processing unit (GPU) 34, an internal memory 36, and an external bus interface (EBI) 38. The modem processor 22 performs processing for data transmission and reception (e.g., encoding, modulation, demodulation, and decoding). The video processor 24 performs processing on video content (e.g., still images, moving videos, and moving texts) for video applications such as camcorder, video playback, and video conferencing. The controller/processor 26 may direct the operation of various processing and interface units within digital section 20. The display processor 28 performs processing to facilitate the display of videos, graphics, and texts on a display unit 30. The ARM/DSP 32 may perform various types of processing for the wireless device 10. The graphics processing unit 34 performs graphics processing.

The techniques described herein may be used for any of the processors in the digital section 20, e.g., the video processor 24. The internal memory 36 stores data and/or instructions for various units within the digital section 20. The EBI 38 facilitates the transfer of data between the digital section 20 (e.g., internal memory 36) and a main memory 40 along a bus or data line DL.

The digital section 20 may be implemented with one or more DSPs, micro-processors, RISCs, etc. The digital section 20 may also be fabricated on one or more application specific integrated circuits (ASICs) or some other type of integrated circuits (ICs).

The techniques described herein may be implemented in various hardware units. For example, the techniques may be implemented in ASICs, DSPs, RISCs, ARMs, digital signal processing devices (DSPDs), programmable logic devices (PLDs), field programmable gate arrays (FPGAs), processors, controllers, micro-controllers, microprocessors, and other electronic units.

FIG. 2A shows an exemplary H.264 standard range register 50 and FIG. 2B shows an exemplary H.264 standard offset register 60. The basic idea of the binary arithmetic coding process is recursive interval division. The arithmetic decoding engine core keeps two registers. The first register is a range register 50 with 9-bits. The second register is an offset register 60 which is 9-bits in a regular mode and 10-bits in a bypass mode.

FIG. 2C shows an exemplary H.264 standard most probability symbol (MPS) case generally denoted by reference numeral 50A, and FIG. 2D shows an exemplary H.264 standard least probability symbol (LPS) case generally denoted by reference numeral 50B. The range register keeps track of the width of the current interval. The offset is from the bitstream and a point to the current location within the range. It should be noted that many of the equations and expressions set forth below use syntax similar to C or C++ computer programming language. The expressions are for illustrative purposes and can be expressed in other computer programming languages with different syntax.

When decoding a bin, the range is divided into two subintervals rLPS 52 and rMPS 54 depending on the context to decode a specific bin. The subintervals rLPS 52 and rMPS 54 are defined in equation Eqs.(1) and (2)

$$rLPS = range * pLPS, \text{ and} \quad (1)$$

$$rMPS = range * pMPS = range * (1 - pLPS) = range - rLPS, \quad (2)$$

where pLPS is the probability of the least probability symbol; and pMPS is the probability of the most probability symbol. The subinterval rLPS 52 and rMPS 54 where the offset falls, decides whether the bin is a MPS or a LPS bin. If the offset is >=rMPS, the bin is a LPS bin. Otherwise, the bin is a MPS bin. After the bin is decided, the range and offset are updated. The term pMPS is the probability. The probability should within 0 to 1. The term rMPS is the range*pMPS. The summation of the probabilities of MPS and LPS should be equal to 1.

In various configurations below, flowchart blocks are performed in the depicted order or these blocks or portions thereof may be performed contemporaneously, in parallel, or in a different order.

Figure 3:
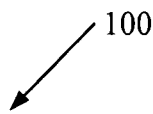
FIG. 3 shows a sample (psuedocode) instruction set of a H.264 standard arithmetic decoding process for one bin.

FIG. 3 a sample (psuedocode) instruction set of a H.264 standard arithmetic decoding process 100 for one bin. The instruction set indicates that both the range register 50 and offset register 60 are 9 bits. The range register 50 configuration is also indicated. The instruction set indicates that the range is within $2^8 <= range < 2^9$. The arithmetic decoding process 100 is abbreviated and begins at an instruction where a determination is made whether range is >offset>=0. If the determination is "No," the process 100 ends. However, if the determination is "Yes," the next set of instructions is an if-else set. The if statement checks to see if the offset is >=rMPS. If the determination is "Yes," the bin is a LPS case. Then the range is updated to a new range (range_new) set equal to the subinterval rLPS (FIG. 2D) and the new offset (offset_new) is set equal to offset–rMPS.

If the if condition is "No," then the bin is a MPS case. Then the range is updated to a new range (range_new) set equal to the subinterval rMPS and the new offset (offset_new) is set equal to offset.

Figure 4:
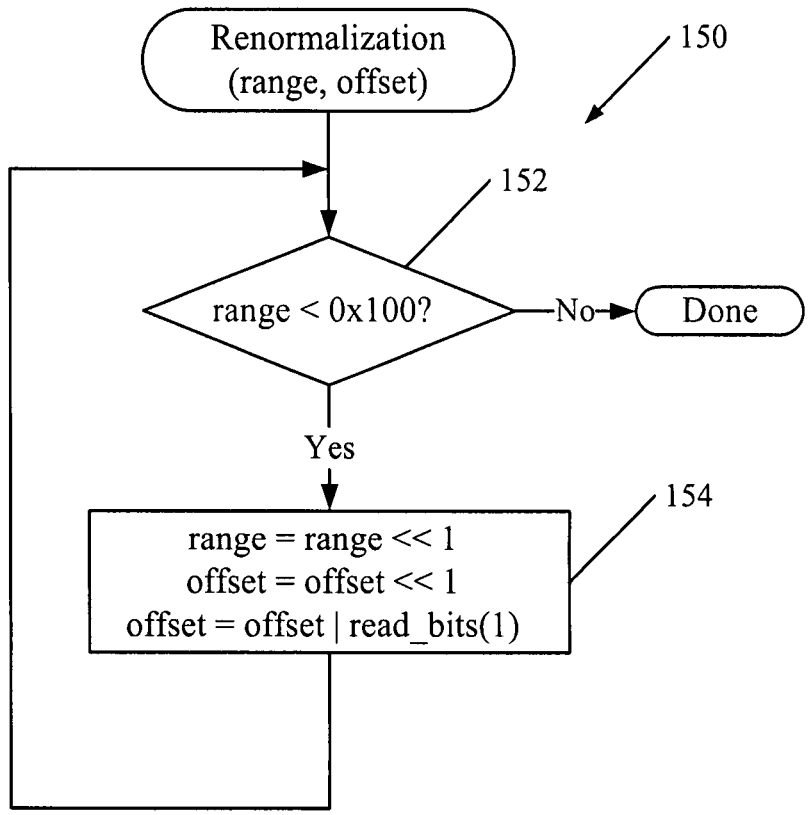
FIG. 4 shows a flowchart of a H.264 standard renormalization process.

FIG. 4 shows a flowchart of a H.264 standard renormalization process 150. After decoding one bin, the range and the offset will be renormalized to keep the precision to decode the next bin. The standard renormalization process 150 ensures that the most significant bit (MSB) of the 9-bit range register 50 is always 1, as represented in FIG. 2A. The standard renormalization process 150 begins with block 152 where a decision is made whether the range is <0X100. At block 152, the value of the range is compared with 256 (or 0x100) If the determination is "No," the process 150 ends. However, if the determination at block 152 is "Yes," then block 152 is followed by block 154. At block 154, the range is left shifted by one bit denoted by range=range<<1. Likewise, the offset is left shifted by one bit, denoted by offset=offset<<1. The offset is also set to offset (bitwise OR) read_bits (1). The expression offset (bitwise OR) read_bits (1) represents the value of the RANGE/OFFSET registers shifted left by one bit. After the shift, the least significant(right most) bit is 0. The expression read_bits (1) reads one bit from the bitstream and this one bit is added to the least significant(right most) bit of offset register 60.

Block 154 loops back to block 152 described above. The loop of blocks 152 and 154 are repeated until the determination at block 152 is "No," which completes the renormalization process 150.

Figure 5:
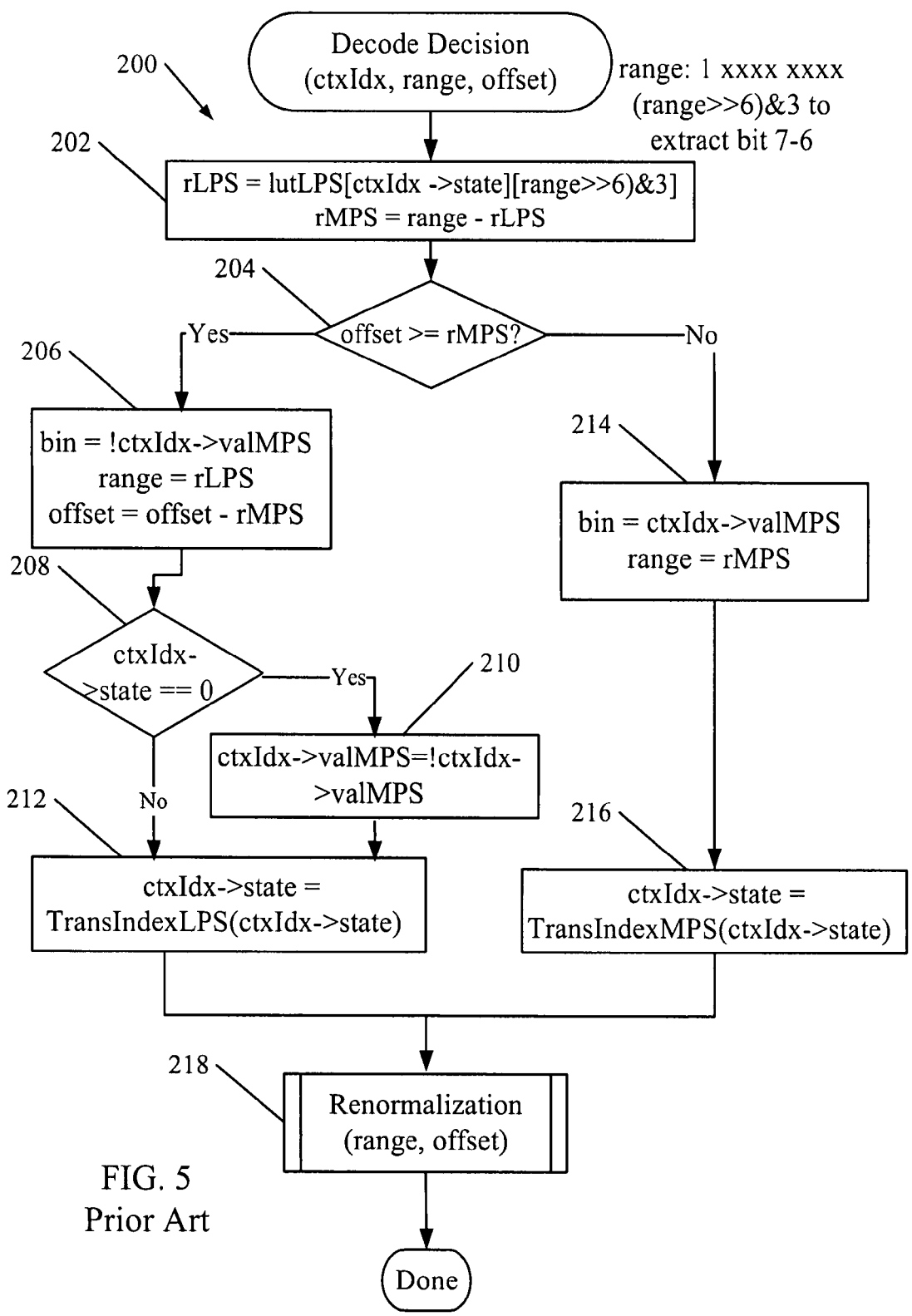
FIG. 5 shows a flowchart of a H.264 standard normal decoding mode process.

FIG. 5 shows a flowchart of a H.264 standard normal decoding mode process 200. In the standard decoding process 200, to avoid multiplication, a 64×4 look up table (LUT) is used to approximate the rLPS set forth in equation Eq.(1) above. The range is approximated by equal-partitions of the 9-bit range register 50 into four cells. The pLPS is approximated by 64 quantized values indexed by a 6-bit context state. Therefore, at block 202, the rLPS is calculated according to equation Eq.(3)

$$rLPS=lutLPS[ctxIdx\text{->}state][(range\text{>>}6)\&3] \quad (3)$$

where ctxIdx is an input to the process 200, represents the index to the context state and provides state information; range>>6 represents a right shift by 6 bits or a division by $2^6$; and the result of (range>>6)&3 extracts bits 7-6 (the 2 bits after the MSB) in the range register 50 used to address the LUT. The expression ctxIdx->state can take a value from 0 to 63 which is used in the 64×4 LUT to get the rLPS. For example, if a range is 0b1 xx yy yyyy, the range will be within 0x100 to 0x1FE, and (range>>6)&3 is used to get "xx" of the range. The expression & is a bitwise AND function.

At block 202, the rMPS is also calculated according to equation Eq.(4)

$$rMPS=range-rLPS \quad (4)$$

where rLPS is calculated in equation Eq.(3).

Block 202 is followed by block 204 where a determination is made whether the offset>=rMPS. If the determination is "Yes," then block 204 is followed by block 206 where the bin, range and offset are calculated according to equations Eq.(5), (6) and (7)

$$bin=!ctxIdx\text{->}valMPS \quad (5)$$

$$range=rLPS, and \quad (6)$$

$$offset=offset-rMPS \quad (7)$$

where !ctxIdx->valMPS denotes an expression where ctxIdx->valMPS can take a value 0 or 1, and "!" means bit flip. The term ctxIdx is the input parameter to the function, and it provides the state and valMPS information. The term valMPS represents the bin output in the MPS case.

Block 206 is followed by block 208 where a determination is made whether ctxIdx->state is equal to 0. If the determination at bock 208 is "Yes," then block 208 is followed by block 210 where ctxIdx->valMPS is assigned to equal !ctxIdx->valMPS. Block 210 is followed by block 212. Additionally, if the determination at block 208 is "No," then block 208 is also followed by block 212. At block 212, ctxIdx->state is assigned to equal TransIndexLPS(ctxIDx->state). After each bin is decoded, the state/valMPS associated with each ctxIdx needs to be updated. The terms TransIndexLPS/TransIndexMPS are just 2 LUTs defined in the H.264 standard to calculate the state transition.

Returning again to block 204, if the determination at block 204 is "No," then block 204 is followed by block 214 where bin and range are calculated according to equations Eq.(8) and (9)

$$bin=ctxIdx\text{->}valMPS; and \quad (8)$$

$$range=rMPS. \quad (9)$$

Block 214 is followed by block 216 where ctxIdx->state is assigned to equal TransIndexLPS(ctxIDx->state). Both blocks 212 and 216 proceed to block 218 where the renormalization process 150 takes place. Block 218 ends the process 200.

Figure 6:
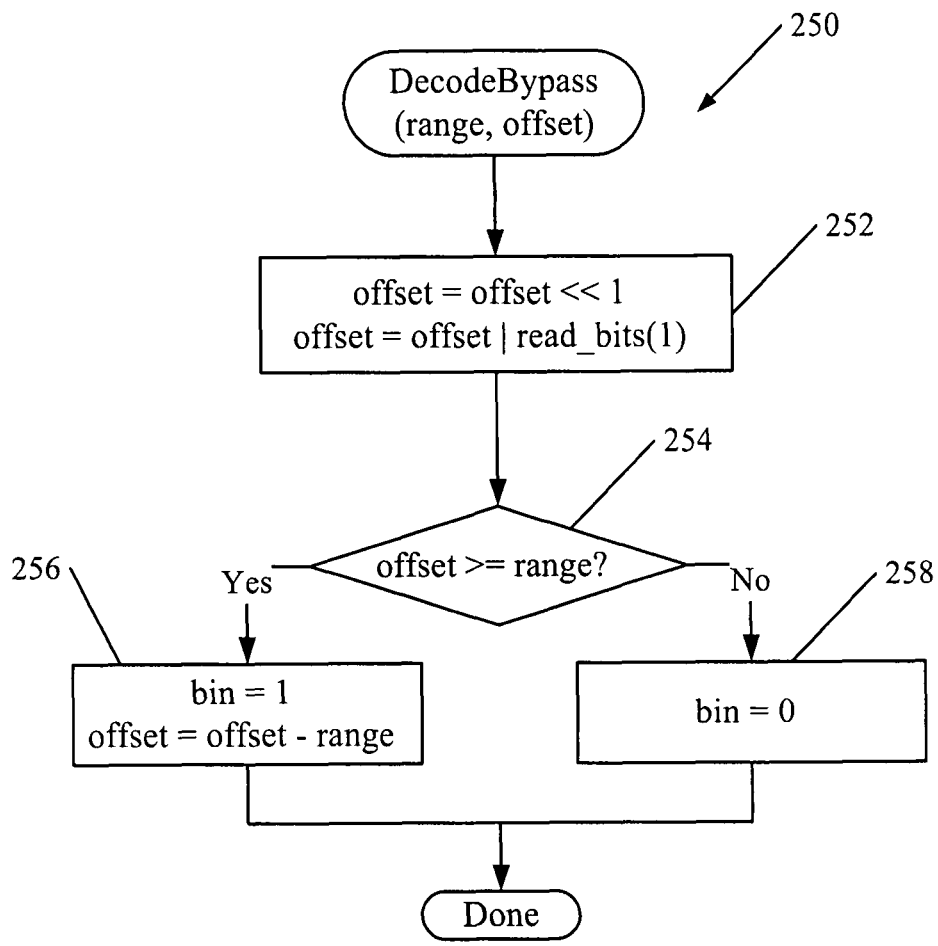
FIG. 6 shows a flowchart of a H.264 standard bypass decoding mode process.

FIG. 6 shows a general flowchart of a H.264 standard bypass decoding mode process 250. For the bypass decoding mode process 250. In the H.264 standard bypass decoding mode process 250, the offset is shifted left by 1 bit and 1 bit is read from the bit stream. The new offset is compared with the range to determine whether the bin is 1 or 0.

The standard bypass decoding mode process 250 begins with block 252 where the offset is set equal to offset <<1 where <<1 represents multiply by 2 or a left shift by 1. Furthermore offset is set equal to offset (bitwise OR) read_bits(1). Block 252 is followed by block 254 where a determination is made whether offset is >=range. If the determination is "Yes," then block 254 is followed by block 256 where bin and offset are calculated according to equations Eq.(10) and (11)

$$Bin=1; and \quad (10)$$

$$Offset=offset-range. \quad (11)$$

If the determination is "No," then block 254 is followed by block 258 where the bin is set equal to zero (0). Blocks 256 and 258 end the process 250. It should be noted that the term bin is also the same as bit.

Figure 7:
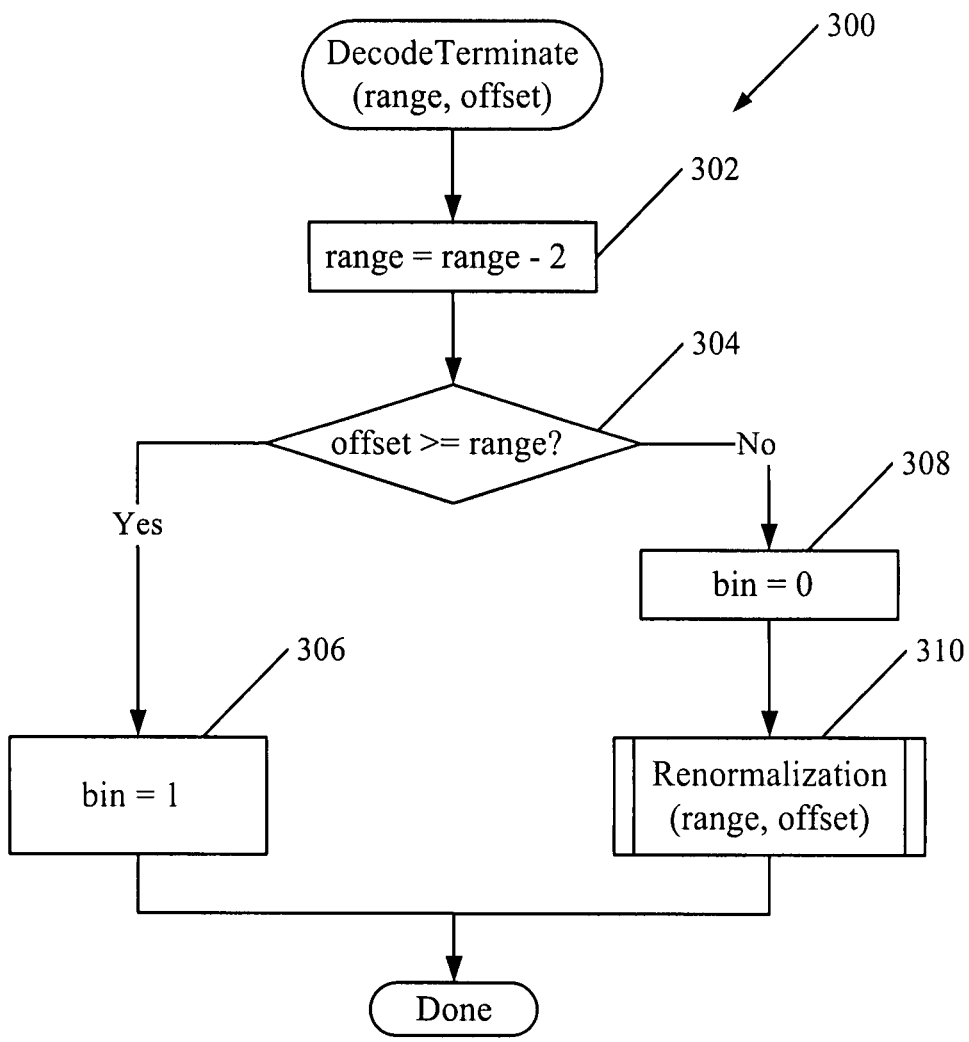
FIG. 7 shows a flowchart of a H.264 standard terminate decoding process.

FIG. 7 shows a flowchart of a H.264 standard terminate decoding process 300. When decoding the bin indicating the end_of_slice_flag and the I-Pulse Code Modulation (I_PCM) mode, a special decoding routine the standard terminate decoding process 300 is called. The standard terminate decoding process 300 begins with block 302 where the range is decremented by 2 (range=range−2). Block 302 is followed by block 304 where a determination is made whether the offset is >=range. If the determination at block 304 is "Yes," then the bin is set equal to one (1) at block 306. However, if the determination at block 304 is "No," then block 304 is followed by block 308 where the bin is set equal to zero (0). Block 308 is followed by block 310 where the renormalization process 150 (FIG. 4) is performed. Both blocks 306 and 310 end the H.264 standard terminate decoding process 300.

During the CABAC initial stage, the range register 50 (FIG. 2A) is set to 0x1FE, 9 bits are read from the bitstream to set the initial offset register 60.

As can be readily seen from above, the 9 bits are used to represent both the range and offset. Therefore, there are a great number of bit wise operations in the CABAC core processes.

In the H.264 standard normal decoding mode process 200 (FIG. 5), whenever an LPS case, since the LPS probability is <0.5, the new range will be <0x100. Thus, renormalization is needed to bring the range>=0x100. In the new exemplary configuration, a count_leading zero (CLZ) instruction is used to calculate the amount of left shift needed instead of using a loop. Whenever a MPS case, since the MPS probability is >=0.5, the new range will be from 0x080 to 0x1FE. Therefore, at most one left shift is needed for renormalization to bring the most significant bit (MSB) to 1. At the same time, the offset is left shifted by the same amount and new bits are read from the bit stream to fill it up.

Moreover, in the H.264 standard bypass decoding mode process 250, the offset is always left shifted by 1 and 1 bit is read from the bitstream. This requires very frequent renormalization and reading of bits from the bit-stream both of which are very computationally costly.

Figure 8A:
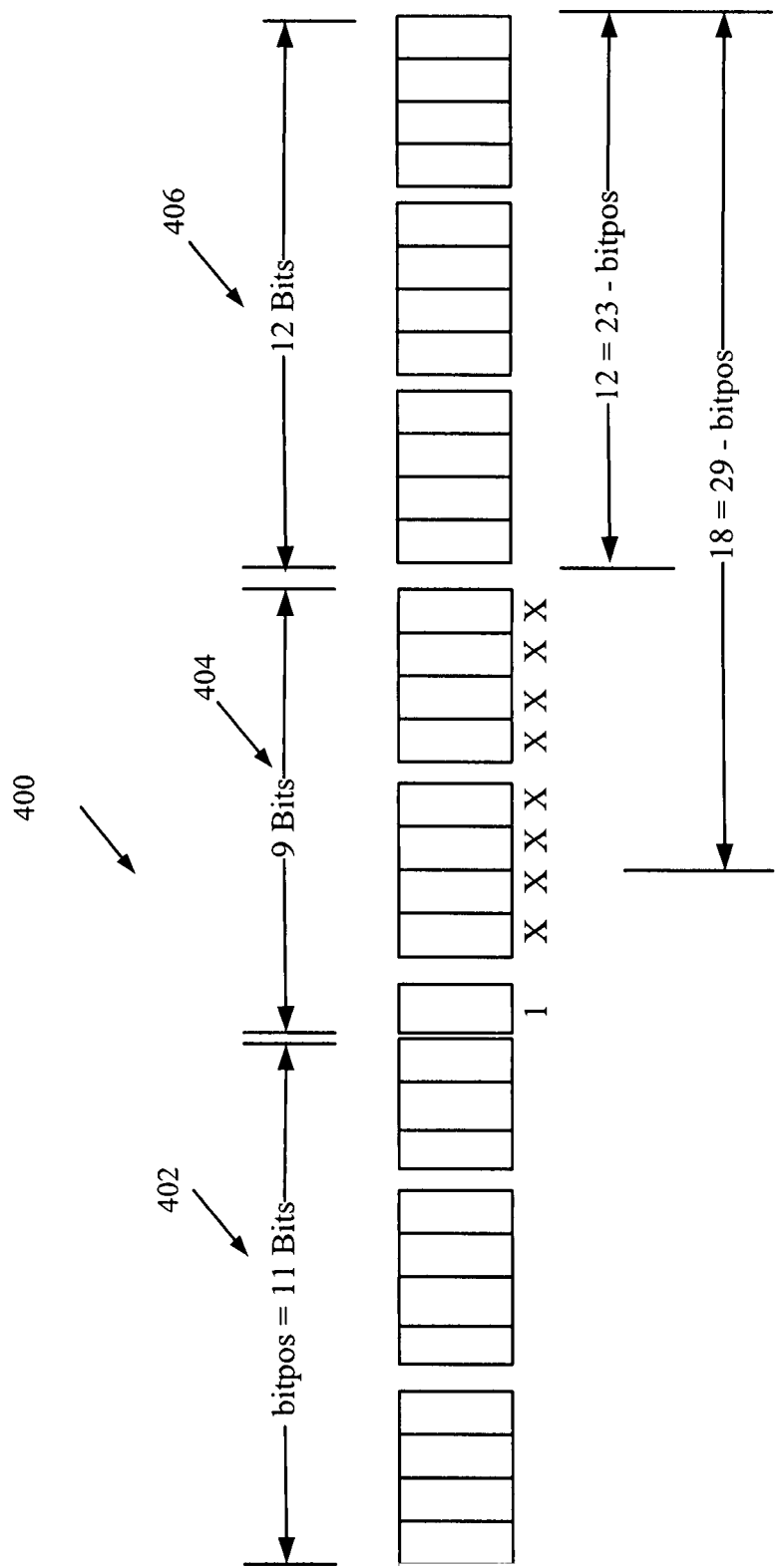
FIGS. 8A and 8B show a modified range register and an offset register.
Figure 8B:
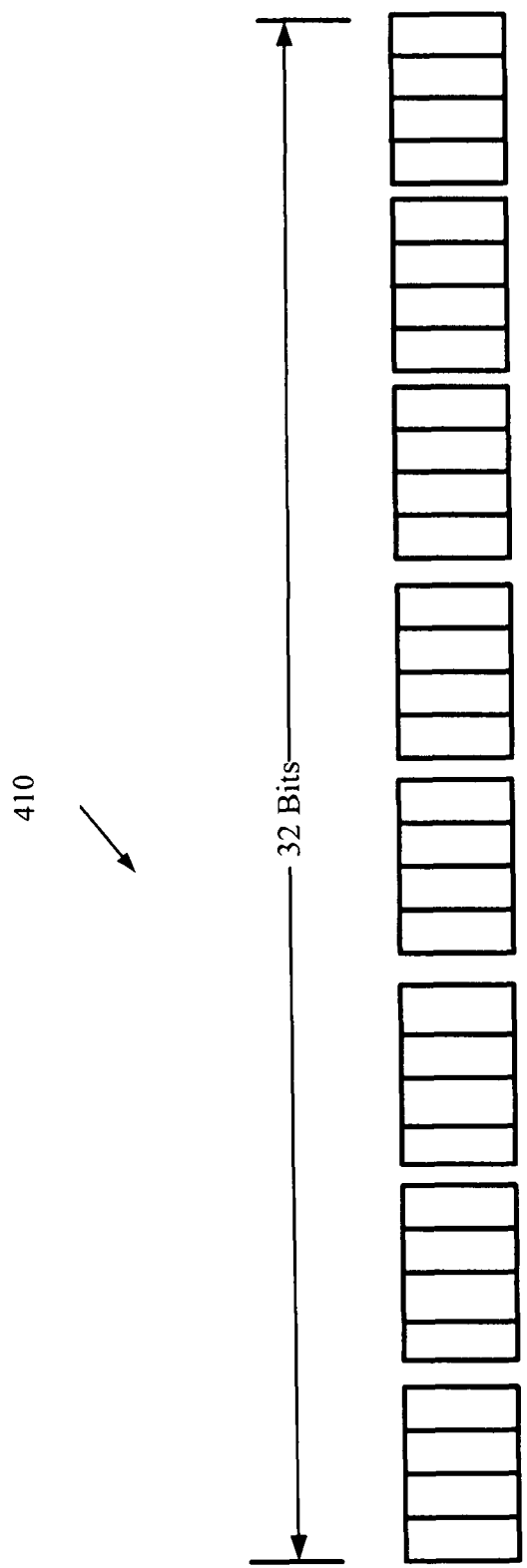

FIGS. 8A and 8B show a modified range register 400 and an offset register 410 of an exemplary configuration. The range register 400 and the offset register 410 maybe 32 or 64 bits. For illustrative purposes, the disclosure describes the implementation of a 32 bit range register 400 and offset register 410.

During the CABAC core initial stage, the range register 400 should be set to 0xFF000000=0x1FE<<23, the offset register 410 should be set to the first 4 bytes read from the bit-stream since the starting bit position of the CABAC part bit-stream is byte-aligned.

As shown in FIG. 8A, the range register 400 is comprised of a plurality of parts. In the exemplary configuration, the 32 bits are divided into a leading zeros part 402, an effective 9-bits part 404, and a trailing zeros part 406. The bitpos (bit position) is indicated by the number of leading zeros bits in the leading zeros part 402 and is calculated using a Count_leading_zeros instruction. The bitpos in the 32 bit implementation is 11 bits. The number of trailing zeros, in the trailing zeros part 406 is (32−9−bitpos)=(23−bitpos). The number of bits in at least one part of the range register 400 may be varied.

The two bits after the first bit 1 from the most significant bit (MSB) is extracted from the range register 400 and used to look up the rLPS. The looked up value is left shifted by (23−bitpos) to align with the effective 9-bits part 404 in the range register 400. The remaining algorithm is almost the same except a more efficient renormalization is used. Whenever range is less than 0x100, both range and offset are left shifted by 24 bits (3 bytes), 3 extra bytes are read from the bitstream and appended to the offset register 410. Therefore, all the bit-stream access is byte-based. This exemplary configuration is an example for illustrative purposes. Moreover instead of 32 bits more or less bits can be used. Furthermore, while the description herein describes bytes which is 8 bits, any number of multiple bits in lieu of the byte arrangements described herein may be used in a renormalization process without iterative loops.

Figure 8C:
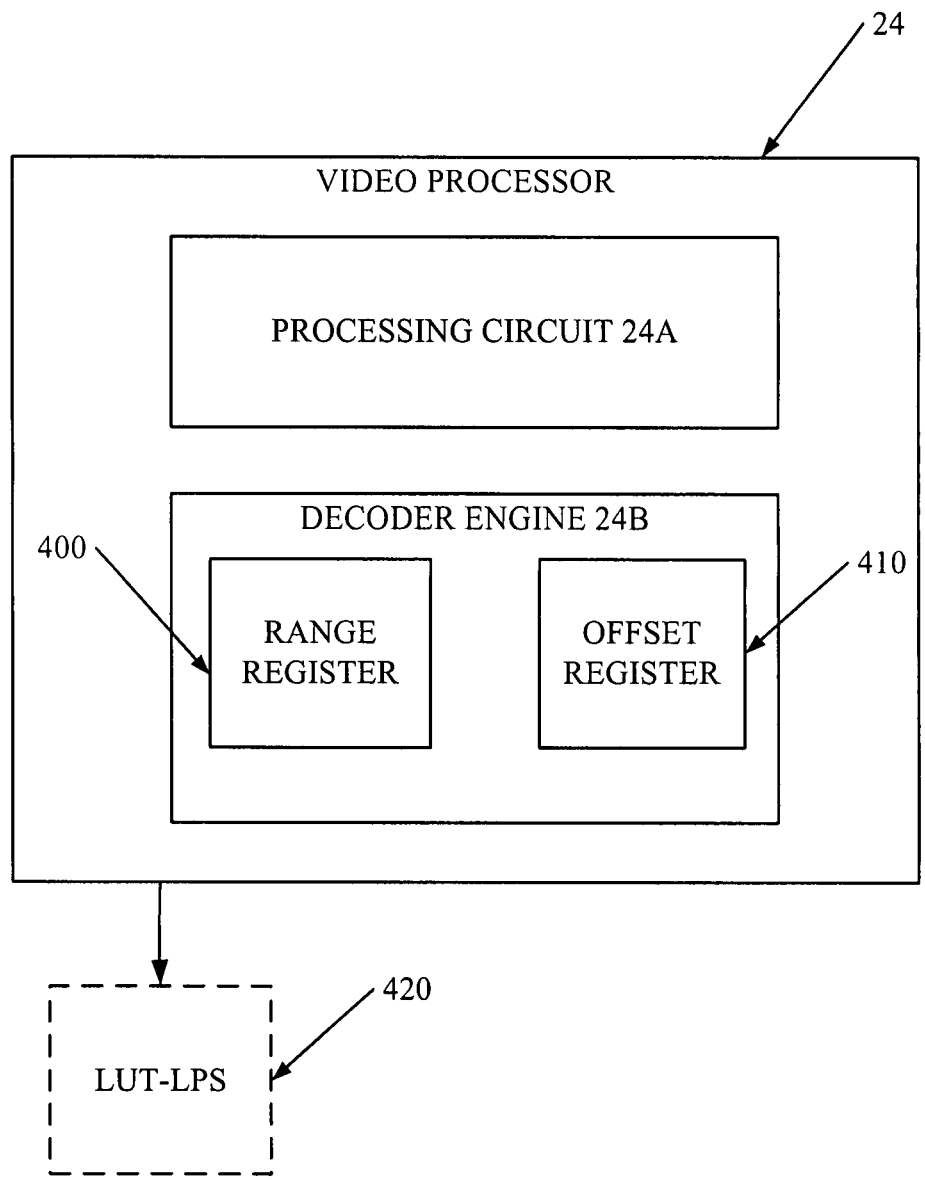
FIG. 8C shows a block diagram of a video processor using the modified range register and an offset register of FIGS. 8A and 8B.

FIG. 8C shows a block diagram of a video processor 24 having a processor circuit 24A and a decoder engine 24B. The decoder engine 24B has the range and offset registers 400 and 410. The video processor 24 communicates with a Look-Up-Table (LUT) 420 for the rLPS. The box 420 is shown in a dotted line to denote that it may be in the video processor 24 or external to the video processor 24. The video processor 24 carries out the processes set forth below.

Figure 9:
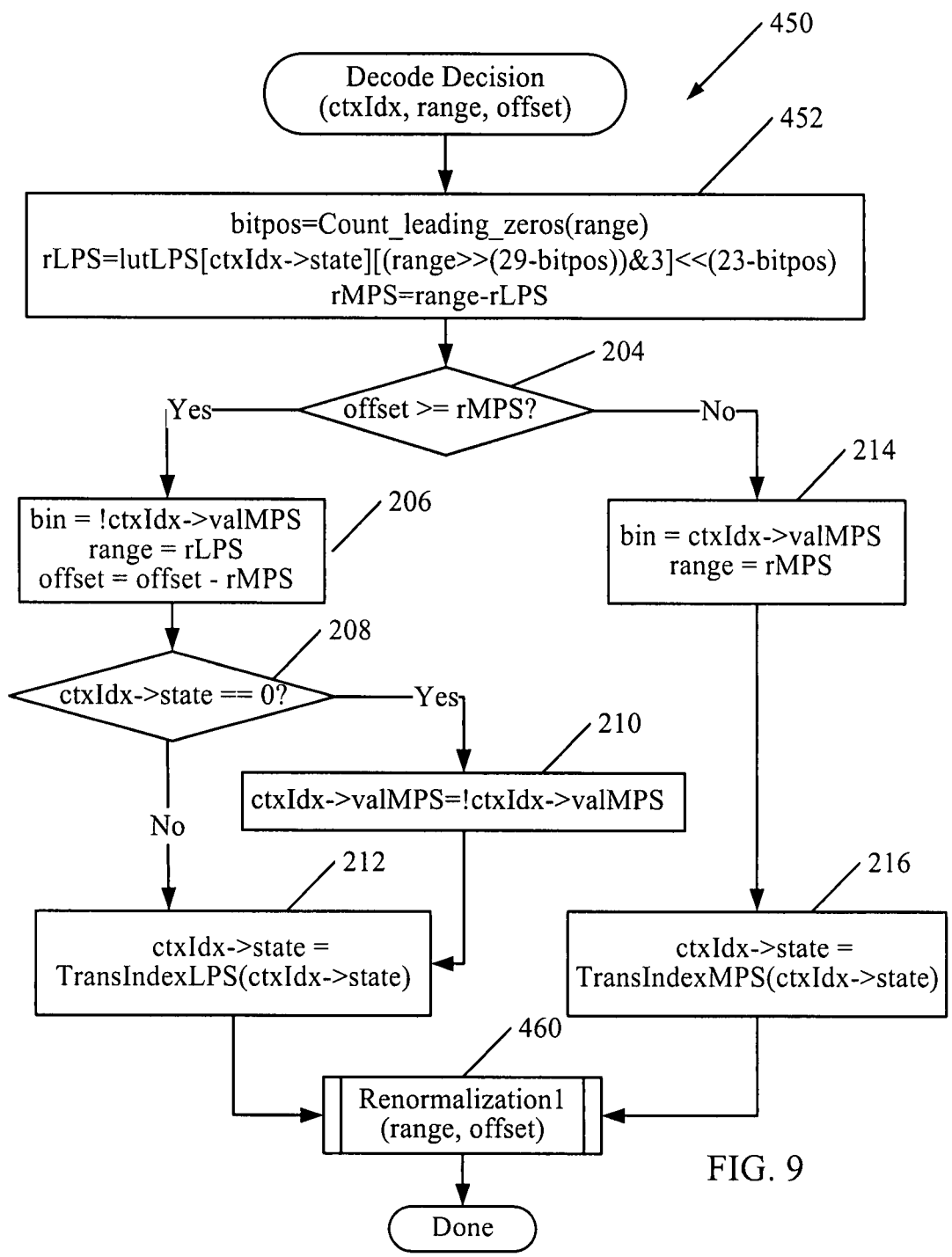
FIG. 9 shows a flowchart of a normal decoding mode process.

FIG. 9 shows a flowchart of a normal decoding mode process 450. The normal decoding mode process 450 is similar to the normal decoding mode process 200 (FIG. 5). The primary differences include blocks 452 and 460. At block 452, bitpos is set equal to count_leading_zeros (range). Furthermore, rLPS is calculated according to equation Eq. (12)

$$rLPS=lutLPS[ctxIdx\text{->}state][(range\text{>>}(29-bitpos))\&3]\text{<<}(23-bitpos) \quad (12)$$

where ctxIdx is an input to the process 450, represents the index to the context state and provides state information; and the result of range>>(29−bitpos))&3 extracts the 2 bits after the leading 1. The expression <<(23−bitpos) is to used to align with the range. The expression ctxIdx->state can take a value from 0 to 63 which is used in the 64×4 LUT to get the rLPS.

In FIG. 9, blocks 204, 206, 208, 210, 212, 214 and 216 correspond to the same numbered blocks in FIG. 5. Hence, no further discussion is necessary. However, the renormalization block of 212 in FIG. 5 is substituted with the renormalization1 process 500 of FIG. 10A.

Figures 10A, 10B, 10C:
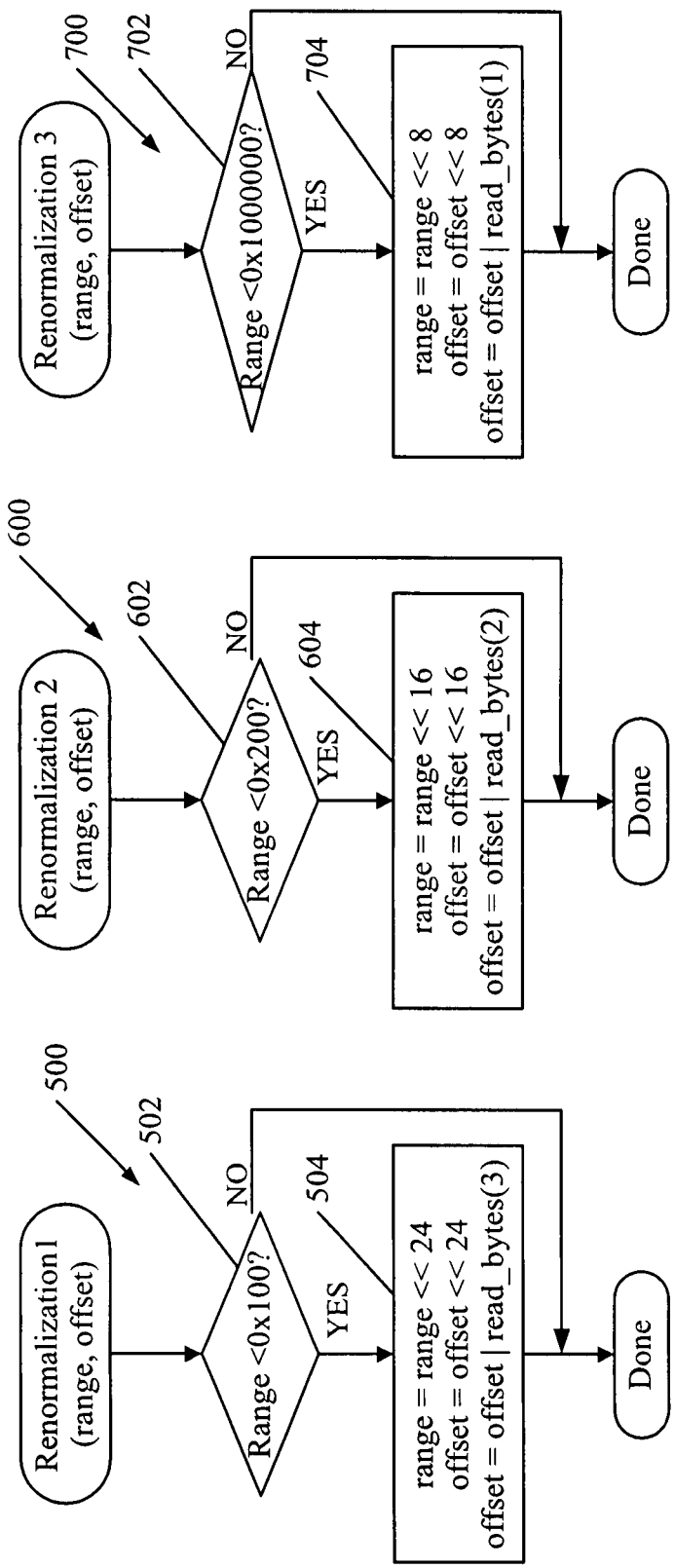
FIG. 10A shows a flowchart of a first renormalization process.
FIG. 10B shows a flowchart of a second renormalization process.
FIG. 10C shows a flowchart of a third renormalization process.

FIG. 10A shows a flowchart of a first renormalization (renormalization1) process 500. The first renormalization process 500 begins with block 502 where a decision is made whether the range is <0X100. If the determination is "No," the process 500 ends. However, if the determination at block 502 is "Yes," then block 502 is followed by block 504. At block 504, the range is shifted by 24 bits denoted by range=range<<24. Likewise, the offset is shifted by 24 bits, denoted by offset=offset<<24. The offset is also set to offset (bitwise OR) read_bytes (3).

Thus, after the offset is shifted left by 24 bits, the right most 24 bits of offset register 410 are all 0. Then 3 bytes (24 bits) are read from the bit stream, and this is added to the offset register 410. As can be seen, the first renormalization (renormalization1) process 500 performs a multi-bit alignment of a register at the same time without an iterative loop operation. In the exemplary configuration, the multi-bit alignment of the range register 400 and 410 occurs in intervals of bytes.

FIG. 10B shows a flowchart of a second renormalization (renormalization2) process 600. The second renormalization process 600 begins with block 602 where a decision is made whether the range is <0X200. If the determination is "No," the process 600 ends. However, if the determination at block 602 is "Yes," then block 602 is followed by block 604. At block 604, the range is shifted by 16 bits denoted by range=range<<16. Likewise, the offset is shifted by 16 bits, denoted by the offset=offset<<16. The offset is also set to offset (bitwise OR) read_bytes (2). Thus, after the offset is shifted left by 16 bits, the right most 16 bits of the offset register 410 are all 0. Then, 2 bytes (16 bits) are read from the bit stream, and this is added to the offset register 410.

FIG. 10C shows a flowchart of a third renormalization (renormalization3) process 700. The third renormalization process 700 begins with block 702 where a decision is made whether the range is <0X1000000. If the determination is "No," the process 700 ends. However, if the determination at block 702 is "Yes," then block 702 is followed by block 704. At block 704, the range is shifted by 8 bits denoted by range=range<<8. Likewise, the offset is shifted by 8 bits, denoted by offset=offset <<8. The offset is also set to offset (bitwise OR) read_bytes (1). Thus, after the offset is shifted left by 8 bits, the right most 8 bits of offset register 410 are all 0. Then, 1 byte (8 bits) are read from the bit stream, and this is added to the offset register 410.

Figure 11:
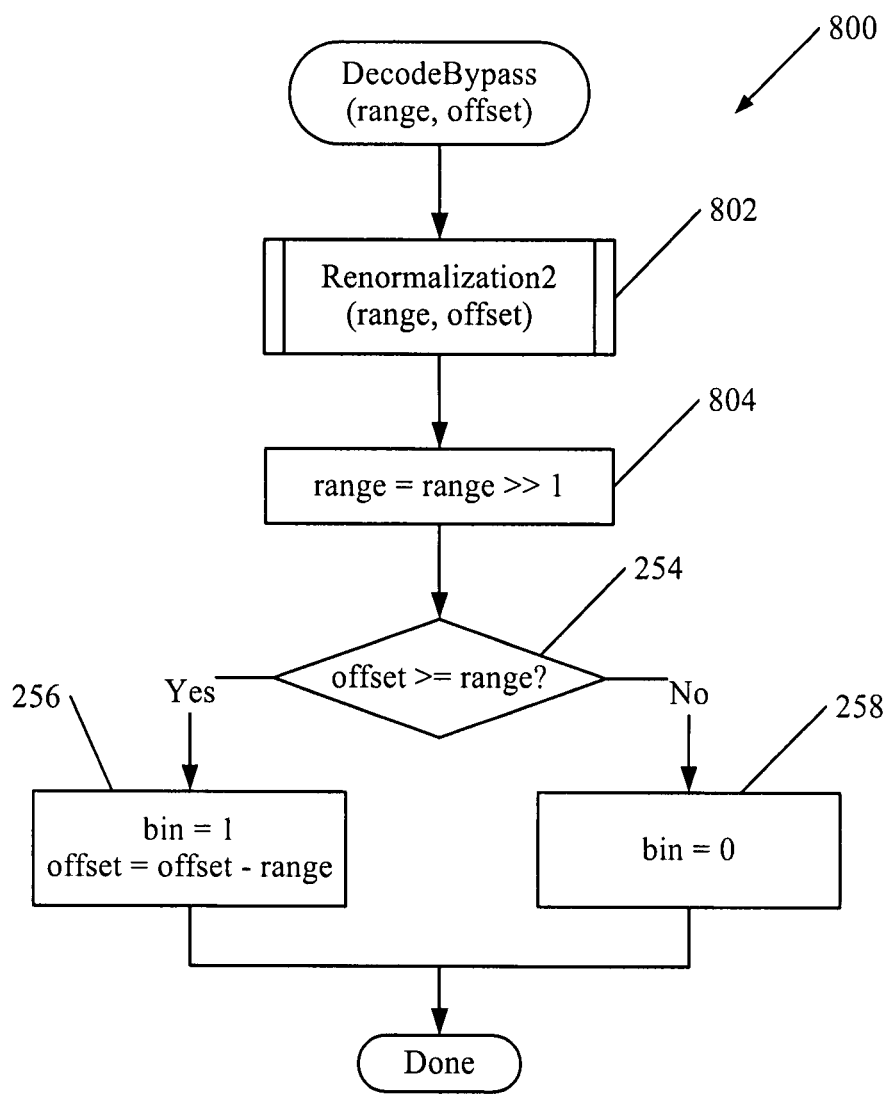
FIG. 11 shows a flowchart of a bypass decoding mode process.

FIG. 11 shows a flowchart of a bypass decoding mode process 800. In the bypass decoding mode process 800, the range is right shifted by 1 and compared with the offset register 410. Thus, the second renormalization process 600 is performed first at block 802. This is to ensure there are at least 10 bits in the range and offset registers 400 and 410, or the range is >=0x200 before the right shift. Block 802 is followed by block 804 where the range is set equal to range>>1.

In FIG. 11, the blocks 254, 256 and 258 correspond to the same numbered blocks in FIG. 6. Hence, no further discussion is necessary.

Figure 12:
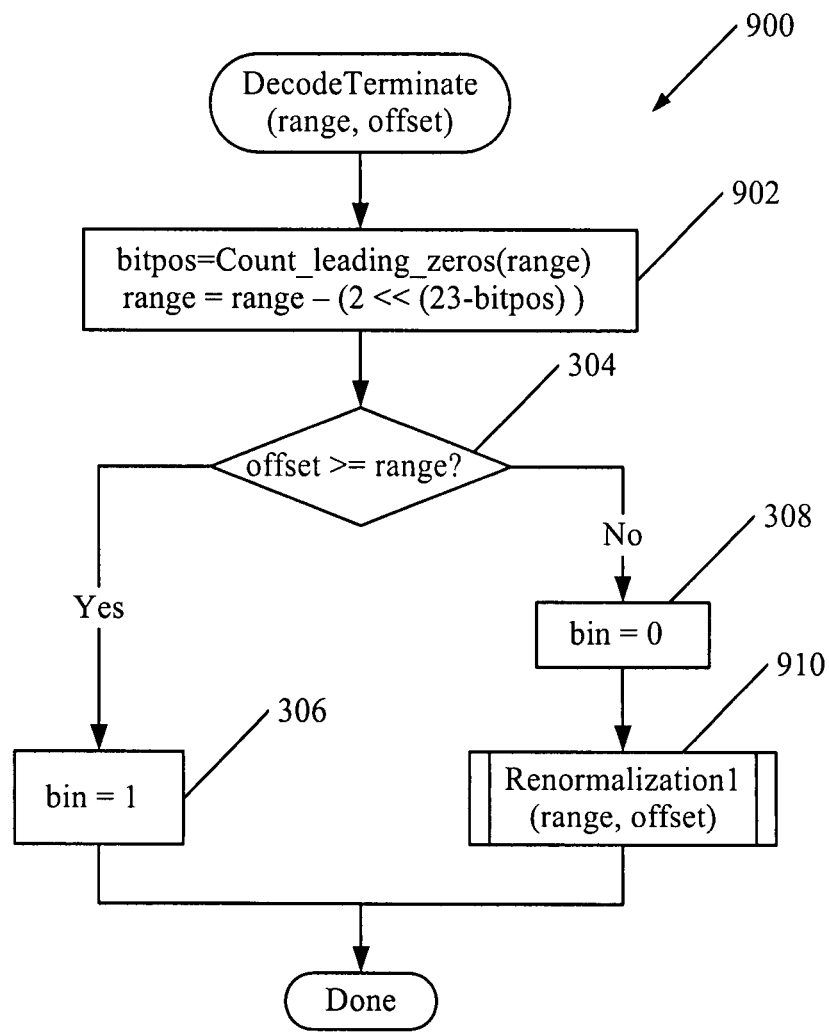
FIG. 12 shows a flowchart of a terminate decoding process.

FIG. 12 shows a flowchart of a terminate decoding process 900. The terminate decoding process 900 begins with block 902 where bitpos is set equal to Count_leading_zeros(range) and range is set decremented by (2<<(23-bitpos)). Block 902 is followed by block 304 where a determination is made whether the offset is >=range.

In FIG. 12, steps 304, 306 and 308 correspond to the same numbered blocks in FIG. 7. Hence no further discussion is necessary. Like FIG. 7, after block 308, normalization takes place. However, in FIG. 12, the first normalization process 500 of FIG. 10A is used at block 910 where block 910 follows block 308. Both blocks 306 and 910 end the terminate decoding process 900.

Multiple Symbol Decoding for Bypass Mode

The bypass decoding mode process 800 applies to two cases, either to sign or exponential Golomb binarization (EG) code. For a case where bypass bin is a sign, only one bypass bin is decoded for each motion vector difference (mvd) or coeff_level_minus1. The EG code only appears as a suffix of the bin strings of an absolute motion vector difference (abs_mvd) or abs_coeff level_minus1. And only those bins with an abs_mvd>8 or an abs_coeff_level_minus1>13 contain a suffix of the EG code. Table 1 identifies a bin string with a prefix and suffix for abs_coeff level_minus 1. Table 2 identifies a bin string with a prefix and suffix for abs_mvd. The term coeff_level_minus1 is from the transform coefficient levels and abs represents the absolute value. Table 3 summaries the EG code prefix and suffix.

With a bit rate increase (quantization step QP decrease, residual coefficients level increase), it is expected that the residual coefficient decoding will increase proportionally since the major increase will be in the EG code of abs_coeff_level_minus1. In a software implementation, it is important to improve the EG decoding by decoding multiple bins at the same time. In a hardware implementation, if hardware (HW) is designed such that multiple bins can be decoded within 1 cycle, it can put an upper bound on the CABAC decoding of any bit-rate bitstreams. Since there is no context involved in the bypass mode, the use of 32 bit range and offset register make multiple bypass bin decoding in one shot possible. The EC code and the terms residual coefficients level increase and residual coefficient decoding are known in the H.264 standard. The term "one shot" means decoding all the bits of a codeword at the same time instead of decoding one by one. As will be seen from the description herein, the exemplary configuration can speed up the EG code decoding.

TABLE 1 abs_coeff_level

| abs_coeff_level-1 | Prefix: TU code | Suffix: EG0 code |
|---|---|---|
| 0 | 0 | |
| 1 | 1 0 | |
| 2 | 1 1 0 | |
| 3 | 1 1 1 0 | |
| 4 | 1 1 1 1 0 | |
| 5 | | |
| ... | | |
| ... | 1 1 1 1 1 1 1 1 1 1 1 1 0 | |
| 13 | 1 1 1 1 1 1 1 1 1 1 1 1 1 0 | |
| 14 | 1 1 1 1 1 1 1 1 1 1 1 1 1 1 | 0 |
| 15 | 1 1 1 1 1 1 1 1 1 1 1 1 1 1 | 1 0 0 |
| 16 | 1 1 1 1 1 1 1 1 1 1 1 1 1 1 | 1 0 1 |
| 17 | 1 1 1 1 1 1 1 1 1 1 1 1 1 1 | 1 1 0 0 0 |
| 18 | 1 1 1 1 1 1 1 1 1 1 1 1 1 1 | 1 1 0 0 1 |
| 19 | 1 1 1 1 1 1 1 1 1 1 1 1 1 1 | 1 1 0 1 0 |

TABLE 1-continued abs_coeff_level

| abs_coeff_level-1 | Prefix: TU code | Suffix: EG0 code |
|---|---|---|
| 20 | 1 1 1 1 1 1 1 1 1 1 1 1 1 1 | 1 1 0 1 1 |
| 21 | 1 1 1 1 1 1 1 1 1 1 1 1 1 1 | 1 1 1 0 0 0 0 |
| 22 | 1 1 1 1 1 1 1 1 1 1 1 1 1 1 | 1 1 1 0 0 0 1 |
| ... | ... | ... |

TABLE 2 abs_mvd

| abs_mvd | Prefix: TU code | Suffix: EG3 code |
|---|---|---|
| 0 | 0 | |
| 1 | 1 0 | |
| 2 | 1 1 0 | |
| ... | | |
| ... | | |
| 7 | 1 1 1 1 1 1 1 0 | |
| 8 | 1 1 1 1 1 1 1 1 0 | |
| 9 | 1 1 1 1 1 1 1 1 1 | 0 0 0 0 |
| 10 | 1 1 1 1 1 1 1 1 1 | 0 0 0 1 |
| 11 | 1 1 1 1 1 1 1 1 1 | 0 0 1 0 |
| ... | 1 1 1 1 1 1 1 1 1 | 0 ... |
| 15 | 1 1 1 1 1 1 1 1 1 | 0 1 1 0 |
| 16 | 1 1 1 1 1 1 1 1 1 | 0 1 1 1 |
| 17 | 1 1 1 1 1 1 1 1 1 | 1 0 0 0 0 0 |
| 18 | 1 1 1 1 1 1 1 1 1 | 1 0 0 0 0 1 |
| ... | 1 1 1 1 1 1 1 1 1 | 1 0 ... |
| 31 | 1 1 1 1 1 1 1 1 1 | 1 0 1 1 1 0 |
| 32 | 1 1 1 1 1 1 1 1 1 | 1 0 1 1 1 1 |
| 33 | 1 1 1 1 1 1 1 1 1 | 1 1 0 0 0 0 0 0 |
| 34 | 1 1 1 1 1 1 1 1 1 | 1 1 0 0 0 0 0 1 |
| ... | 1 1 1 1 1 1 1 1 1 | 1 1 0 ... |
| 63 | 1 1 1 1 1 1 1 1 1 | 1 1 0 1 1 1 1 0 |
| 64 | 1 1 1 1 1 1 1 1 1 | 1 1 0 1 1 1 1 1 |
| 65 | 1 1 1 1 1 1 1 1 1 | 1 1 1 0 0 0 0 0 0 0 |
| ... | ... | ... |

TABLE 3

EG code prefix and suffix

| EG code prefix | Num of bits in EG suffix | | EG_prefix_value | |
|---|---|---|---|---|
| | EG0 | EG3 | EG0 | EG3 |
| 0 | Non | 3 | 0 | 0 |
| 1 0 | 1 | 4 | 1 = 0b 1 | 8 = 0b 1 0 0 0 |
| 1 1 0 | 2 | 5 | 3 = 0b 1 1 | 24 = 0b 1 1 0 0 0 |
| 1 1 1 0 | 3 | 6 | 7 = 0b 1 1 1 | 56 = 0b 1 1 1 0 0 0 |
| ... | ... | ... | ... | ... |

As shown in Tables 1 and 2, the EG code contains a prefix and, in most cases, a suffix. The prefix is unary coded. The number of bins in the suffix is determined by the prefix. By way of an example specified in the Table 3 below, if the EG code prefix is "10", then the number of bits in the EG0/EG3 suffix is 1/4 as specified in the $2^{nd}$ row in Table 3. Table 3 summarize the prefix and suffix of a EG0 code and a EG3 code. Theoretically, the prefix/suffix part can be decoded as in FIGS. 13A and 14A.

FIG. 13A shows a sample instruction set for a prefix EG code decoding process 1000. FIG. 13B shows a range and offset relationship diagram the prefix EG code decoding process of FIG. 13A. The sample instruction set for process 1000 evaluates whether the offset is less than a set of threshold T1, T2, T3 and T4 where T1 is equal to ½ of the range; T2 is ¾ of the range; T3 is ⅞ of the range; and T4 is 15/16 of the range. If the offset is less than T1, range is right shifted by 1 and the bit 0 is returned. If the offset is less than T2, offset=offset−T1, and range is right shifted by 2 and the bits 10 are returned. If the offset is less than T3, offset subtracted and set to T2 and range is right shifted by 3 and the bits 110 are returned. If the offset is less than T4, offset subtracted and set to T3 and range is right shifted by 4 and the bits 1110 are returned.

In FIG. 13B, the values of offset at T1, T2, T3 and T4 are shown in relation to the range.

FIG. 14A shows a sample instruction set for a suffix EG code decoding process 1010. FIG. 14B shows a range and offset relationship diagram for the suffix EG code decoding process of FIG. 14A. FIG. 14A shows a sample instruction set for a suffix EG code decoding process 1010. The sample instruction set for process 1010 evaluates whether the offset is less than a set of threshold T1, T2, T3, T4, T5, T6 and T7 where T1 is equal to ⅛ of the range; T2 is ⅔ of the range; T3 is ⅜ of the range; T4 is ⅘ of the range; T5 is ⅝ of the range; T6 is ⅚ of the range; and T7 is ⅞ of the range. If the offset is less than T1, the bits 000 are returned. If the offset is less than T2, offset=offset−T1, and the bits 001 are returned. If the offset is less than T3, offset subtracted and set to T2 and the bits 010 are returned. If the offset is less than T4, offset subtracted and set to T3 and the bits 011 are returned. If the offset is less than T5, offset subtracted and set to T4 and the bits 100 are returned. If the offset is less than T6, offset subtracted and set to T5 and the bits 101 are returned. If the offset is less than T7, offset subtracted and set to T6 and the bits 110 are returned. Else offset is offset subtracted and set to T7 and the bits 111 are returned. After any of the returns, range is right shifted by 3.

In FIG. 14B, the values of offset, at T1, T2, T3, T4, T5, T6 and T7 are shown in relation to the range.

Figures 15A, 15B:
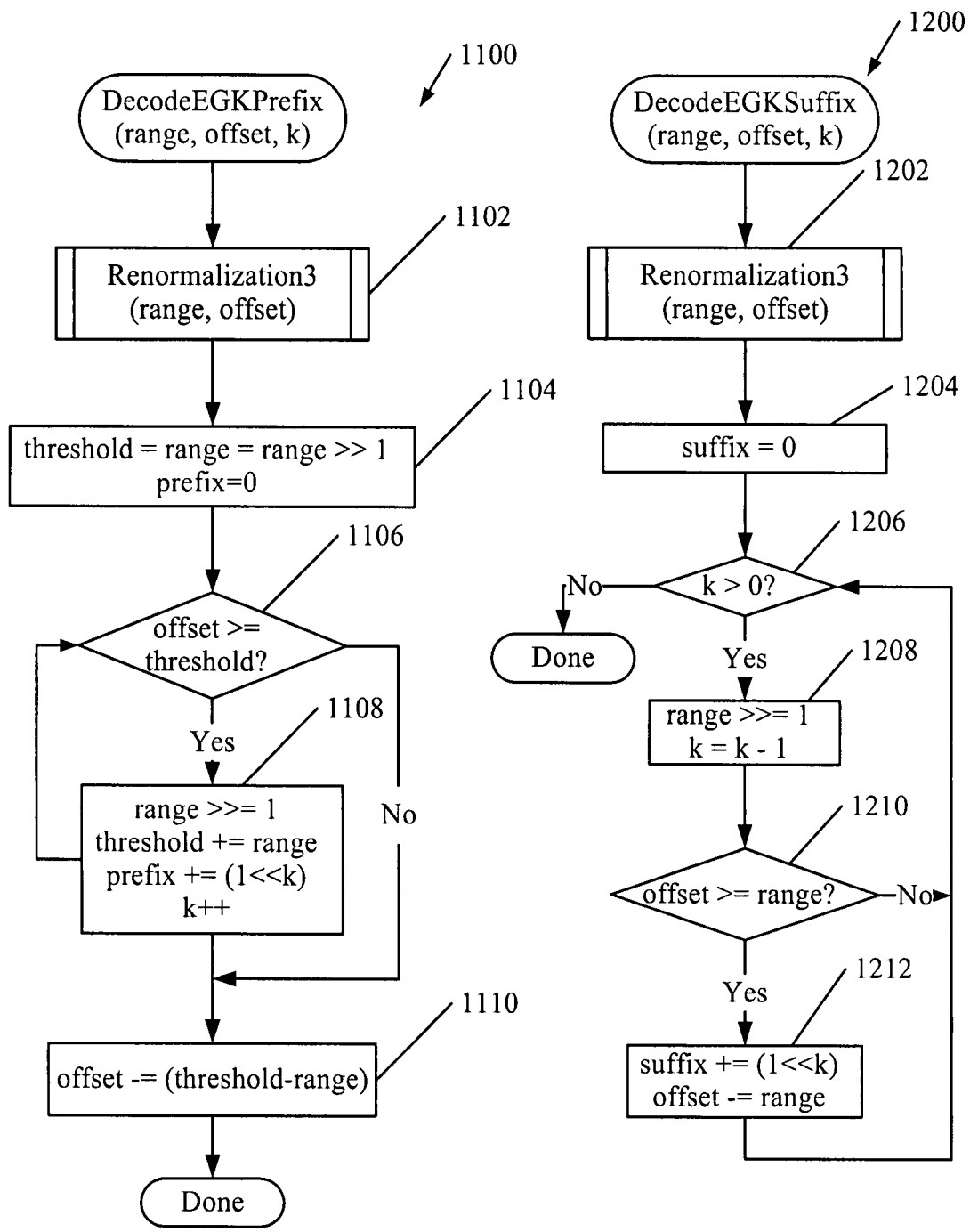
FIG. 15A shows a flowchart of a prefix EGK code decoding process.
FIG. 15B shows a flowchart of a suffix EGK code decoding process.

FIG. 15A shows a flowchart of a prefix EGK code decoding process 1100. FIG. 15B shows a flowchart of a suffix EGK code decoding process 1200. An exemplary software implementation for decoding the prefix or suffix is shown. Since decoding each bin will right shift range by 1 and the range must >=0x100 after decoding the last bin, the range/offset are first renormalized such that range>=0x1000000. This way, it can accommodate to decode up to 16 consecutive bins. In a simulation, with a QP set to 1, the recorded maximum number of bins in EG code prefix/suffix was 9. For example, decoding each bit will consume 1 bit in the range register. If range>=0x1000000, after decoding the last bit, the range will be >=0x100. Thus, there are 16 bits which can be decoded. This is possible with the 32 bit range register 400.

The prefix EGK code decoding process 1100 begins with block 1102 where the third renormalization process 700 takes place. Block 1102 is followed by block 1104 where threshold is assigned to the range where the range is right shifted by 1. Furthermore, a prefix is assigned to 0. Block 1104 is followed by block 1106 where a determination is made whether the offset is >=threshold. If the determination at block 1106 is "Yes," block 1106 is followed by block 1108. At block 1108, the range is right shifted by 1, the threshold is incremented by the range and the prefix +=(1<<k) and k++. The expression prefix +=(1<<k) is essentially expressed as prefix=prefix+(1<<k); and k++ increments k by 1 for the loop.

Block 1108 is followed by block 1110 where the offset is −=(threshold−range). The expression offset −=(threshold−range) is also expressed as offset=offset−(threshold−range). Block 1110 ends the process 1100. At block 1106, if the determination is "No," block 1106 proceeds to block 1110. The term k is the input to the DecodeEGKPrefix and DecodeEGKSuffix function. As the input to DecodeEGKPrefix function, it should be 0 for EG0 and 3 for EG3 code. The input to DecodeEGKSuffix function is the value k come out of the DecodeEGKPrefix function. The expression prefix +=(1<<k) is also shown in Table 3 below. For example, 1110 ($4^{th}$ row) means the prefix is 7 for EG0 code, which is 0b 111=(1<<0)+(1<<1)+(1<<2). The expression offset −=(threshold−range) is the same as offset=offset−(threshold−range).

The suffix EGK code decoding process 1200 begins with block 1202 where the third renormalization process 700 takes place. Block 1202 is followed by block 1204 where suffix is set to 0. Block 1204 is followed by block 1206 where a determination is made whether k is greater than 0. If the determination is "No," the process 1200 ends.

However, if the determination is "Yes," then block 1206 is followed by block 1208 where range is right shifted by 1 and k is decremented by 1. Block 1208 is followed by block 1210 where a determination is made whether offset is >=range. If the determination is "No," then block 1210 returns to block 1206. However, if the determination at block 1210 is "Yes," block 1210 is followed by block 1212 where suffix is +=(1<<k) and offset is −=range. The expression suffix +=(1<<k) calculates the value of a binary string. For example, 0b 1010=(1<<3)+(1<<1) and the Offset=offset−range. Block 108 is followed by block 1110 where offset is assigned to threshold−range. Block 1110 ends the process 1100. At block 1106, if the determination is "No," block 1106 proceeds to block 1110.

Experimental Results

Tables 4-5 show the MIPS and cycles/function_call comparison between the standard and the new optimized core. These numbers are obtained on the Kayak sequence on DSP simulator, with level 3 compiler optimizations and with default data and instruction cache size.

TABLE 4

MIPS Comparison between Standard and New Core

| Bit Rate | | Decode Decision | | Decode Bypass | | Decode EGK | | Overall MIPS | |
|---|---|---|---|---|---|---|---|---|---|
| Mbps | QP | Original | Optimized | Original | Optimized | Original | Optimized | Original | Optimized |
| 6.40 | 20 | 179.64 | 117.41 | 20.71 | 10.80 | 10.05 | 3.83 | 541.01 | 451.10 |
| 2.55 | 28 | 72.44 | 47.90 | 6.87 | 3.58 | 5.40 | 2.07 | 256.36 | 220.18 |
| 1.53 | 32 | 44.38 | 29.80 | 3.80 | 1.98 | 3.46 | 1.33 | 172.33 | 150.87 |
| 0.91 | 36 | 27.01 | 18.66 | 2.15 | 1.12 | 2.34 | 0.90 | 117.67 | 105.29 |
| 0.55 | 40 | 16.95 | 12.03 | 1.23 | 0.64 | 1.44 | 0.55 | 84.00 | 76.78 |

TABLE 5

Cycles/Function Call Comparison between Standard and New Core

| Bit Rate Mbps | QP | Decode Decision | | Decode Bypass | | Decode EGK | |
|---|---|---|---|---|---|---|---|
| | | Original | Optimized | Original | Optimized | Original | Optimized |
| 6.40 | 20 | 28.62 | 18.70 | 19.75 | 10.30 | 164.06 | 62.47 |
| 2.55 | 28 | 28.26 | 18.68 | 19.77 | 10.31 | 161.28 | 61.91 |
| 1.53 | 32 | 27.78 | 18.65 | 19.78 | 10.32 | 160.51 | 61.64 |
| 0.91 | 36 | 26.90 | 18.58 | 19.82 | 10.32 | 160.98 | 61.79 |
| 0.55 | 40 | 26.13 | 18.54 | 19.83 | 10.32 | 160.32 | 61.58 |

Tables 4 and 5 shows a comparison of the bit rate, the quantization step size QP to the decode decision processes 200 and 450 of FIGS. 5 and 9. Tables 4 and 5 also shows a comparison for the decode bypass processes 250 and 800 of FIGS. 6 and 11 and the decode process of the EGK code. Table 4 also shows the results of the MIPS.

If 64 bit registers is used and special attention is paid at the CABAC initial stage, one will able to make the reading 4 bytes aligned and save cycles further. The threshold to do the first, second and third renormalization processes 500, 600 and 700, shown in FIGS. 10A, 10B and 10C, can be changed to 0x100000000 so a common renormalization routine is applied. This will change the frequency of reading bytes from the bitstream. It can also change the renormalization check frequency. For example, the renormalization check at the beginning of FIG. 15B at block 1202 can be omitted.

In FIG. 9, the first renormalization process 500 performed at block 460 can be moved to the beginning of the normal decoding mode process 450. If a 32 bit range register is used and the renormalization threshold is 0x10000, after decoding the first symbol, the smallest possible range register is 0x600. A range register of 0x600 is still >0x100 and can decode the next symbol without renormalization. Hence, with more than a 9 bit range/offset register, it enables decoding multiple bins without re-normalization. Since the original re-normalization is bit-based therefore it is very costly. Thus, the arrangement of the range register 400 can simplify the hardware architecture to decode 2 consecutive normal mode symbols.

FIGS. 16A, 16B and 16C shows a CABAC residual block syntax arrangement. To decode 2 consecutive normal mode symbols the significant_coeff_flag and last_significant_coeff_flag, as seen in FIGS. 16A and 16B, are decoded in pairs. If the significant_coeff_flag is 0, this indicate the coefficient is a zero coefficient and there is no last_significant_coeff_flag. If the significant_coeff_flag is 1, this indicates the coefficient is a non-zero coefficient and the next symbol to decode is last_significant_coeff_flag. Therefore, the value of the pair can take either 0 or 10 or 11. Since the pair needs to be decoded for each residual coefficients of the 4×4 block, the potential speedup/saving is quite significant. The terms significant_coeff_flag and last_significant_coeff_flag are defined in the H.264 standard.

The matrix or block 1400 in FIG. 16C is an exemplary illustration of a data set. The values in the Table 1350 in FIG. 16B are derived from the data set of FIG. 16C. The syntax element stream 1300 is derived from the Table of 1350.

As long as there are enough bits in the range/offset register, the renormalization check can be skipped.

In one or more exemplary configurations, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed configurations is provided to enable any person skilled in the art to make or use the disclosure. Various modifications to these configurations will be readily apparent to those skilled in the art, and the generic principles defined herein may be applied to other configurations without departing from the spirit or scope of the disclosure. Thus, the disclosure is not intended to be limited to the configurations shown herein but is to be accorded the widest scope consistent with the principles and novel features disclosed herein.

What is claimed is:

1. A device comprising:
   a processing circuit operative to implement a set of instructions to decode multiple bins simultaneously and renormalize an offset register and a range register, wherein the renormalization occurs in intervals of bytes, and wherein renormalizing the offset register and the range register comprises a first type of renormalization process employed by a bypass decoding mode process and a second type of renormalization process employed, after normal decoding, by a normal decoding mode process, wherein the first type of renormalization process comprises shifting the range register and the offset register by multiple bytes based on whether the range register is less than a first threshold, and wherein the second type of renormalization process comprises shifting the range register and the offset register by multiple bytes based on whether the range register is less than a second threshold; and
   a memory coupled to the processing circuit.

2. The device according to claim 1, wherein the set of instructions to renormalize includes count leading zero instructions to calculate an amount of left shift needed to multi-bit align the range register and the offset register.

3. The device according to claim 1, wherein the multiple bins are represented in an exponent Golomb binarization (EG) code.

4. The device according to claim 1, wherein the set of instructions to decode multiple bins includes instructions to decode up to 16 consecutive bins simultaneously.

5. The device according to claim 1, wherein the set of instructions to decode multiple bins is configured to decode context-adaptive binary arithmetic coding (CABAC).

6. The device according to claim 5, wherein the processing circuit further comprises instructions to decode two consecutive normal mode symbols simultaneously.

7. The device according to claim 1, wherein the device comprises a cellular phone, wireless device, wireless communications device, a video game console, a wirelessly-equipped personal digital assistant (PDA), a laptop computer, or a video-enabled device.

8. A device comprising:
   decoding means for decoding multiple bins simultaneously; and
   renormalizing means for multi-bit aligning an offset register and a range register in intervals of bytes, wherein the renormalizing means comprises a first type of renormalizing means employed by a bypass decoding mode process means and a second type of renormalizing means employed, after normal decoding, by a normal decoding mode process means, wherein the first type of renormalizing means comprises shifting the range register and the offset register by multiple bytes based on whether the range register is less than a first threshold, and wherein the second type of renormalization process comprises shifting the range register and the offset register by multiple bytes based on whether the range register is less than a second threshold.

9. The device according to claim 8, wherein the renormalizing means includes calculating means for calculating an amount of left shift needed to multi-bit align the range.

10. The device according to claim 8, wherein the decoding means includes means for decoding an exponent Golomb binarization (EG) code.

11. The device according to claim 8, wherein decoding means comprises means for decoding context-adaptive binary arithmetic coding (CABAC).

12. The device according to claim 11, wherein the decoding means includes means for decoding two consecutive normal mode symbols simultaneously.

13. An apparatus comprising:
   a decoder having an offset register and a range register and which decodes multiple bins simultaneously and renormalizes the offset register and the range register, wherein renormalization occurs in intervals of bytes, and wherein the renormalizing the offset register and the range register comprises a first type of renormalization process employed by a bypass decoding mode process and a second type of renormalization process employed, after normal decoding, by a normal decoding mode process, wherein the first type of renormalization process comprises shifting the range register and the offset register by multiple bytes based on whether the range register is less than a first threshold, and wherein the second type of renormalization process comprises shifting the range register and the offset register by multiple bytes based on whether the range register is less than a second threshold; and
   a memory coupled to the decoder.

14. The apparatus according to claim 13, wherein the decoder calculates an amount of left shift needed to multi-bit align the range register and the offset register.

15. The apparatus according to claim 13, wherein the decoder decodes an exponent Golomb binarization (EG) code.

16. A computer program product including a non-transitory computer readable storage medium having instructions for causing a computer to:
   decode multiple bins simultaneously; and
   renormalize for multi-bit aligning an offset register and a range register in intervals of bytes, wherein renormalizing the offset register and the range register comprises a first type of renormalization process employed by a bypass decoding mode process and a second type of renormalization process employed, after normal decoding, by a normal decoding mode process, wherein the first type of renormalization process comprises shifting the range register and the offset register by multiple bytes based on whether the range register is less than a first threshold, and wherein the second type of renormalization process comprises shifting the range register and the offset register by multiple bytes based on whether the range register is less than a second threshold.

17. The computer program product according to claim 16, wherein the instructions to renormalize includes instructions to calculate an amount of left shift needed to multi-bit align the range register and the offset register.

18. The computer program product according to claim 16, wherein the instructions to decode include instruction to decode an exponent Golomb binarization (EG) code.

19. The computer program product according to claim 16, wherein the instructions to decode include instructions to decode context-adaptive binary arithmetic coding (CABAC).

20. A method comprising
   decoding multiple bins simultaneously; and
   renormalizing for multi-bit aligning an offset register and a range register in intervals of bytes, wherein the renormalizing comprises a first type of renormalization process employed by a bypass decoding mode process and a second type of renormalization process employed, after normal decoding, by a normal decoding mode process, wherein the first type of renormalization process comprises shifting the range register and the offset register by multiple bytes based on whether the range register is less than a first threshold, and wherein the second type of renormalization process comprises shifting the range register and the offset register by multiple bytes based on whether the range register is less than a second threshold;
   wherein the method is performed in an electronic unit.

21. The method according to claim 20, wherein the renormalizing includes calculating an amount of left shift needed to multi-bit align the range register and the offset register.

22. The method according to claim 21, wherein the decoding includes decoding an exponent Golomb binarization (EG) code.

23. The method according to claim 21, wherein the decoding includes decoding context-adaptive binary arithmetic coding (CABAC).

* * * * *